United States Patent
Treutlein et al.

(10) Patent No.: US 6,740,816 B2
(45) Date of Patent: May 25, 2004

(54) FILM COMPOSITE, METHOD FOR PRODUCING THE SAME AND ITS USE

(75) Inventors: Roland Treutlein, Pirk (DE); Werner Geitner, Irchenrieth (DE); Thomas Kesmarszky, Pirk (DE)

(73) Assignee: W.E.T. Automotive Systems AG (DE)

(*) Notice: Subject to any disclaimer, the term of this patent is extended or adjusted under 35 U.S.C. 154(b) by 0 days.

(21) Appl. No.: 10/031,766
(22) PCT Filed: May 28, 2001
(86) PCT No.: PCT/DE01/02011
§ 371 (c)(1), (2), (4) Date: Jan. 23, 2002
(87) PCT Pub. No.: WO01/93280
PCT Pub. Date: Dec. 6, 2001

(65) Prior Publication Data
US 2002/0104676 A1 Aug. 8, 2002

(30) Foreign Application Priority Data
May 30, 2000 (DE) .......................... 100 26 714

(51) Int. Cl.⁷ .................................................. H01B 7/08
(52) U.S. Cl. ................................ 174/117 F; 174/117 A
(58) Field of Search .................. 174/117 F, 117 FF, 174/117 A, 250

(56) References Cited

U.S. PATENT DOCUMENTS

| | | | |
|---|---|---|---|
| 3,612,743 A | | 10/1971 | Angele et al. |
| 4,075,420 A | | 2/1978 | Walton |
| 4,548,661 A | | 10/1985 | Escallier et al. |
| 5,861,578 A | * | 1/1999 | Hake et al. ............ 174/120 R |
| 6,071,551 A | * | 6/2000 | Hols ..................... 361/301.4 |

FOREIGN PATENT DOCUMENTS

| | | |
|---|---|---|
| EP | 0 208 138 A1 | 6/1986 |
| EP | 0 644 560 A1 | 9/1994 |
| JP | 5-314824 * | 11/1993 |
| JP | 6-176629 * | 6/1994 |

* cited by examiner

Primary Examiner—Chau N. Nguyen

(57) ABSTRACT

The invention relates to a halogen-free composite film including at least three to N sealable, multi-layered composite film(s), wherein N is an integer from 4 to 10, and in which a functional layer and/or a functional element is interposed between the individual composite films, in addition, the invention relates to a method for manufacturing the halogen-free composite film and its use as a flexible, multi-purpose material.

19 Claims, 3 Drawing Sheets

FILM COMPOSITE, METHOD FOR PRODUCING THE SAME AND ITS USE

BACKGROUND OF THE INVENTION

The present invention relates to a new halogen-free composite film, a process for its manufacture, and its use as a flexible, multi-purpose material.

In recent years, the demand for halogen-free films and halogen-free laminated films has grown tremendously on account of expanding environmental awareness and increasingly stringent legal requirements. The use of halogen-free films averts the production of toxic reaction products during temperature build-up in the event of fire. The materials that were primarily used hitherto, such as polyvinyl chloride compounds, no longer satisfy these requirements. In addition, laminated films should also satisfy requirements for high temperature resistance, low shrinkage, and excellent chemical resistance, especially excellent hydrolytic resistance. Moreover, these laminated films should be simple and fast to produce so that they satisfy commercial requirements.

The disadvantages of the known films that are used for the manufacture of ribbon cables are that they are not flexible enough, they are too heavy, and above all are not adequately temperature resistant. They tend to delaminate at high temperatures. Many films are insufficiently chemical resistant and also have low tensile strength. When the known films are used for ribbon cable, the inserted stranded wire can corrode in certain applications if it is not protected adequately.

Thus for example, from DE 42 00 311 A1 is known an adhesive-free ribbon cable of noncrystalline or semicrystalline thermoplastic that is manufactured by hot pressing of thermoplastic strips and metallic conductors. Although these ribbon conductors have good thermal loading capacity and a long service life, they have the disadvantage that they are relatively stiff and consequently very susceptible to breakage. A further disadvantage of these ribbon cables is the slow production speed so that economically advantageous manufacture is not possible. Many of the polymers mentioned have low adhesion to copper, and thus do not have good sealing characteristics to this metal, so they are not suitable for many applications. Moreover, two monofilms are used here, which fuse completely in the press at high temperatures and slow manufacturing speeds, and thus are extremely difficult to process in a laminating station.

DE 42 39 982 A1 describes a ribbon cable that is lightweight, does not corrode, and has excellent electrical conductivity. The cable comprises a plurality of electrical conductors consisting of layered graphite, which are arranged such that they extend parallel to one another and are encased in an electrically insulating material made of a synthetic resin. These ribbon cables cannot be used at high service temperatures, and hence do not have the necessary temperature stability. Due to the use of halogen-containing compounds to improve the electrical conductivity in conjunction with polyvinyl chloride as a synthetic resin material, there is a risk of these cables forming halogen-containing decomposition products in the event of a fire. Moreover, these halogen-containing ribbon cables are subject to shrinkage, with the result that they no longer satisfy modern requirements. In addition, hydrolysis problems can occur with these ribbon cables, so these cables cannot be used in motor vehicle applications.

DE-OS 27 44 998 describes a flat conductor ribbon cable in which a number of band-shaped conductors that run parallel to one another and spaced apart are adhesively joined to a film of insulating material by an interposed adhesive layer, wherein the spaces between the conductors are covered with an opaque layer that is resistant to ultraviolet radiation. However, these ribbon cables cannot be used in applications in which the conductor's permeability to light is important. Moreover, no quality inspection of the manufactured cables can be performed during and after production.

DE 196 32 153 A1 relates to the use of a plastic mixture for halogen-free cables with polypropylene and/or its copolymers as a basis, which additionally contains magnesium hydroxide. In order to achieve the necessary abrasion resistance and the mechanical characteristics without impairing the required flame resistance, ethylene vinyl acetate and/or its copolymers and the magnesium hydroxide are added in surface-modified form. As a result of the addition of ethylene vinyl acetate, the flame resistant properties are improved through a synergistic effect with magnesium hydroxide. However, a disadvantage of using the above described combination is that these ribbon cables have insufficient temperature resistance and their mechanical and chemical properties are inadequate. Particularly in the automotive field, polyolefin materials cannot be used because of their low flame resistance, modest flow properties and poor dimensional stability.

None of the known films simultaneously fulfills the requirements for good hydrolytic resistance, excellent mechanical and chemical resistance, use at high long-term service temperatures, good flame-resistant properties, and that they be halogen-free.

Consequently, the object of the invention is to prepare a halogen-free composite film and a process for manufacturing the same, wherein the composite film must satisfy the above-mentioned requirements.

SUMMARY OF THE INVENTION

This object is achieved in that the halogen-free composite film in accordance with the invention includes at least one to N sealable, multi-layered laminated films, wherein N is an integer from 2 to 10. A functional layer and/or a functional element is interposed between the individual laminated films. The individual sealable, multi-layered laminated films are composed of a first and a second film that are bonded together by means of a laminating adhesive or lacquer. The films in the individual laminated films can be identical to and/or different from one another.

The functional layer and/or the functional element can be a printed circuit board, a sensor, a metallic stranded wire or a metallic conductor material or an electronic component, wherein the material for the metallic stranded wire or the conductor material is selected from the group consisting of copper, silver, iron, nickel, aluminum, or an alloy of these metals.

The composite film manufactured in accordance with the invention can be used at high long-term service temperatures, has good mechanical resistance, in particular high tensile strength and elongation at break, is resistant to hydrolysis, flame-resistant, and resistant to chemicals, and additionally has low shrinkage.

The process for manufacture of the composite film in accordance with the invention is characterized in that a laminating adhesive or lacquer is applied to the first film of each laminated film, the film thus coated is dried in a drying tunnel at temperatures from 80° C. to 180° C., preferably 100° C. to 120° C., a second film is supplied at the end of the drying tunnel and joined to the first film, then this laminated film is reeled up and the laminating adhesive is finally cured, then a functional layer and/or a functional element is placed between this first laminated film and a second laminated film that was produced in the same manner, and the first laminated film is laminated to the second laminated film.

If the sealing characteristics of the laminated film are not adequate in view of the later application, the side of the laminated film facing the incoming second film is customarily provided with a thermally activated substance. This thermally activated substance achieves the result that the sealing characteristics of the composite film are improved.

Films from the group consisting of LCP (liquid crystal polymer), PPS (polyphenylene sulfide), PET (polyethylene terephthalate), PEN (polyethylene naphthalate), PK (polyketone), PEK (polyetherketone), PEEK (polyetheretherketone), PEKK (polyetherketoneketone), PEEKK (polyetheretherketoneketone), PEI (polyetherimide), PESU (polyether sulfone), PSU (polysulfone), COC (cyclo-olefin copolymer), and polyamide films may be selected as the first and/or second film.

Especially suitable as laminating adhesive or lacquer are adhesives of the type normally made of acrylates, polyurethanes, polyester urethanes, epoxides, copolyesters or natural adhesive resins. These adhesives can be used as single-component or multi-component systems. They may be products that can be used as aqueous dispersions, as solvent-containing systems, or solvent-free systems. Mentioned by way of example here are products in the ADCOTE line from the Rohm & Haas company, which are single-component and multi-component adhesives with good thermal resistance and excellent resistance to chemicals.

The following can be used as thermally activated substances, depending on the later use of the composite film: copolyester systems, cyclo-olefin copolymers, polyurethanes, acrylates and derivatives thereof, vinyl acetate copolymers, polyvinyl alcohols, polyvinyl butyrals, polyvinyl acetates, sealable maleic resins, alkyd resins, polyolefins and polyamides. In addition, saturated, unsaturated, linear and/or branched copolyesters can also be used, such as products from the DYNAPOL line from Degussa. These materials are distinguished by the fact that they are durable yet at the same time are intrinsically flexible, bond well to metals, and have good resistance to chemicals.

Furthermore, solvent-containing multi-component polyurethane primer systems can be used, such as products from the Pentacoll line from Rohm & Haas. This combination of thermally activated substances with a primer is advantageous when extremely high composite strength is required.

The individual laminated films are bonded as described above with a functional layer and/or a functional element into a laminate, in a laminating station, making a composite film for further use. In this context, the individual laminated films can have the same structure, or, depending on the application, can consist of different first and second films and contain different laminating adhesives.

The composite film is suitable as a protective or cover film in the manufacture of flexible printed conductors.

In addition, the composite film in accordance with the invention can be used as a cover film for printed circuit boards. When the composite film is used in the area near an engine, EMC shielding is possible. The ribbon cables manufactured with the laminated film can also be used for industrial white goods.

Moreover, the composite film can be used to manufacture flexible ribbon cables that are used at high service temperatures such as those that occur in applications in the engine area, especially in the automotive field, in airbag technology, for interior wiring in motor vehicles, in motor vehicle headliners, in the engine compartment and in headlights. Especially in the engine compartment and for headlights, long-term service temperatures in excess of 140° C. are necessary; the composite film in accordance with the invention can be used in this application without difficulty.

Any materials that conduct electric current can be used as metallic conductors for the manufacture of ribbon cables. Metals that can be considered include all the customary conductor metals, such as copper, silver, iron, nickel, aluminum, or alloys of these metals. The metals to be processed can be up to 200 $\mu$m in thickness.

Moreover, the composite film can be used as a protective film and/or cover film for flexible printed conductors.

DETAILED DESCRIPTION OF THE INVENTION

Figure 1:
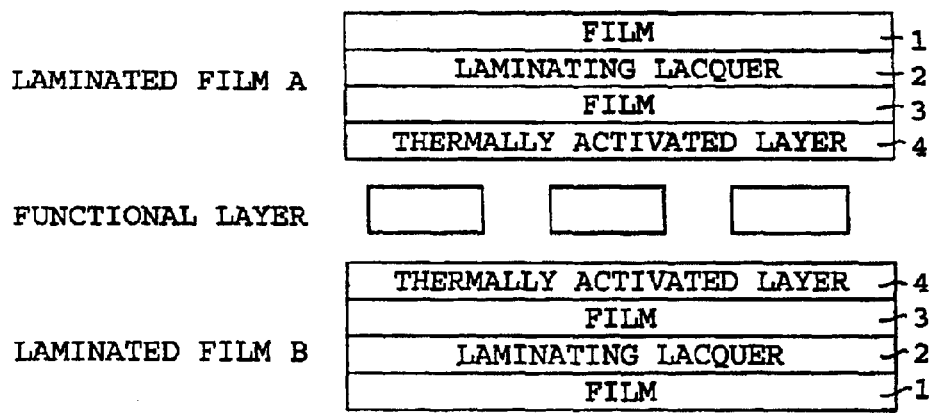
FIG. 1 shows the structure of a ribbon cable manufactured in accordance with one embodiment of the composite film.

Referring now to FIG. 1, for the manufacture of ribbon cables, two identical or different laminated films A and B are used, which consist of a film 1, a laminating lacquer 2, a film 3 and if applicable a thermally activated substance 4. For the functional layer, a metallic conductor, for example stranded copper wire, is laminated between two strips of the laminated films A and B. The process is performed in such a way that a copper foil is cut into narrow strips on the laminating machine and laminated between the two laminated film strips by hot laminating rollers at temperatures ranging from 150° C. to 400° C., preferably 180° C. to 280° C. At the laminating station, the two strips of film with the metallic conductor in the intermediate layer are sealed together through pressure and temperature. As a result of this pressure and temperature treatment, the thermally activated substance or sealing film becomes thermoplastic and bonds to the second strip of film.

A significant advantage of the composite film in accordance with the invention is that it can be used at long-term service temperatures of 140° C. and above. Moreover, the composite film has great flexibility, good thermal resistance, low shrinkage, good mechanical properties such as tensile strength and elongation at break, and good chemical properties such as solvent resistance, resistance to acids, especially battery acid, and to bases, as well as to all types of oils such as motor oil, automatic transmission fluid, transmission oil, fuels, brake fluid, radiator antifreeze, undiluted windshield washer fluid, and the like.

Figure 2A:
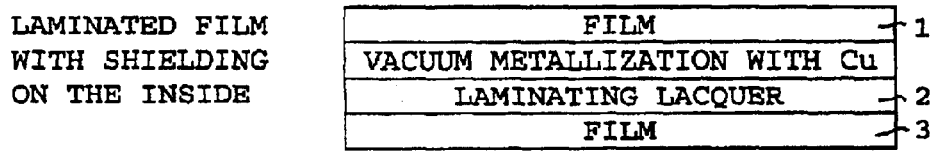
FIGS. 2A and 2B show a laminated film according to the present invention with shielding on the inside and a laminated film with shielding on the outside.
Figure 2B:
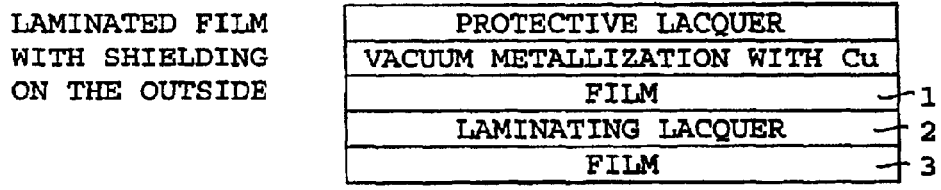

In addition, electromagnetic shielding is possible in a composite with an electrically conductive layer, e.g. with vacuum metallization or metal foil lamination. FIGS. 2A and 2B show a laminated film with shielding on the inside and a laminated film with shielding on the outside. In order to manufacture a laminated film with shielding on the inside, FIG. 2A, the outer film 1 is vacuum metallized with copper in a separate step before the laminating step. Then in the laminating unit, the laminating adhesive 2 is applied to the copper metallized side. Next, the second film 3 is applied, as described above. In a laminated film that is to have shielding on the outside, FIG. 2B, a protective lacquer is applied to the copper metallized film 1, and then the laminating adhesive 2 is applied to the first film, and then the second film 3 is applied, as described above.

EMC shielding is necessary, firstly, when an odd number of metallic stranded wires is placed in the composite film, and secondly, when the ribbon conductor is routed past other electronic components. Here the electric or magnetic field of the unshielded cable would cause interference with the operation of other electrical components (such as radio, window lifts, etc.). With a copper metallized layer, it is possible to achieve 60 to 80 dB of shielding at frequencies above 500 MHz, which, moreover, can be integrated at relatively low cost.

The composite film can be subjected without any difficulty to additional steps such as laser welding, surface welding, spot welding, ultrasonic welding, crimping, laser stripping of insulation and the like.

The films specified below can be used to manufacture the laminated film, and thus for the composite film, as appropriate for the intended applications.

PPS (polyphenylene sulfide) film has high thermal resistance of 160° C. to 180° C., and is thus especially well suited for use in films that must satisfy requirements for high temperature resistance.

PET (polyethylene terephthalate) film has an upper melting point of 255° C. to 260° C., and is thus likewise suitable for use at high long-term service temperatures.

PEN (polyethylene naphthalate) film is resistant to hydrolysis, resistant to UV weathering, and has a high long-term service temperature of approximately 155° C. Hence, it too is suitable for applications requiring high long-term service temperatures.

PK (polyketone) film is a halogen-free film that has good flame-resistant properties and excellent hydrolysis resistance. Among the films based on polyketone or polyetherketone, the following films are also suitable: PEK (polyetherketone), PEEK (polyetheretherketone), PEKK (polyetherketoneketone), PEEKK (polyetheretherketoneketone), PEI (polyetherimide), PESU (polyether sulfone) and PSU (polysulfone).

COC (cyclo-olefin copolymer) film is resistant to acids and bases as well as to aliphatic solvents, is highly transparent, has a low density and extremely low water absorbency. It is thermostable, particularly up to 170° C., and has high stiffness, strength and hardness.

From the family of polyamide films, preferably the PA 6 or PA 12 films and their copolymers are used. The PA films are distinguished by high strength, excellent toughness, good thermoforming properties, high heat resistance, and sealability. With proper finishing (additive), good hydrolysis resistance can also be obtained, as well.

The above-mentioned films do not satisfy the aforementioned requirements for good hydrolysis resistance, excellent mechanical and chemical resistance, usability at high long-term service temperatures, flame resistance and freedom from halogens. Surprisingly however, it has been discovered that the combination in accordance with the invention of different films in the laminated films, and thus in the composite film, that are equipped with a laminating adhesive and if necessary a thermally activated substance in a composite film, gives rise to the above-mentioned advantageous properties, so that the result is a flexible material that has a wide range of applications.

Depending on the subsequent application, the individual films have a thickness between 10 $\mu$m and 100 $\mu$m.

It is advantageous for the wet application weight of the laminating adhesive to be from 2 g/m$^2$ to 40 g/m$^2$, preferably 4 g/m$^2$ to 10 g/m$^2$ wet application, which corresponds to a dry coat between 2 g/m$^2$ and 5 g/m$^2$, preferably 3 g/m$^2$.

The applied adhesive layer is dried at temperatures from 80° C. to 180° C., preferably 100° C. to 120° C.

The above-mentioned thermally activated substances can be applied from solution (lacquer) or from a melt (hot-melt). By means of a reaction mechanism chosen in accordance with the subsequent application, a reaction can be set in motion during lamination, which is to say manufacture of the composite film from the two laminated films, that effects a transformation of the thermoplastic substance into a duroplastic coating, or significantly raises the softening point of the coating.

The composite film in accordance with the invention preferably has the following composition:

In a first embodiment, the first film of a laminated film is a PPS film to which the laminating lacquer is applied and which is subsequently joined to a sealable PET film as the second film; if necessary, this second film is provided with a thermally activated substance. In a second embodiment, the first film of the laminated film is a PPS film that is provided with a coating of laminating lacquer and subsequently joined to a PEN film as the second film, which has a coating of a thermally activated substance if necessary. In another embodiment, the first film of the laminated film is a PPS film that has a laminating lacquer layer and is subsequently joined to a PA film or another thermoplastic plastic as the second film; if necessary the second film can be coated with a thermally activated substance. In each case, the second laminated film for the composite film can have the same structure as the first laminated film or a different structure. The laminated films thus produced have high tensile strength, chemical resistance, hydrolytic resistance and flame resistance, and, moreover, can be used at temperatures of 140° C. and above.

The composite film for a ribbon cable is composed, for example, of at least two identical or differently constructed laminated films. It can be useful, not only in the manufacture of ribbon cables, for the inner film materials of each laminated film to have in general a lower melting point than the outer film materials of the laminated film. As a result of the pressure and temperature treatment in the laminating unit, the metal to be laminated and the two laminated films are bonded to one another by the thermally activated substance. It has been demonstrated that, when very thin stranded metal wires are used, little or no thermally activated substance is necessary to bond the metal to the two laminated films.

Figure 4:
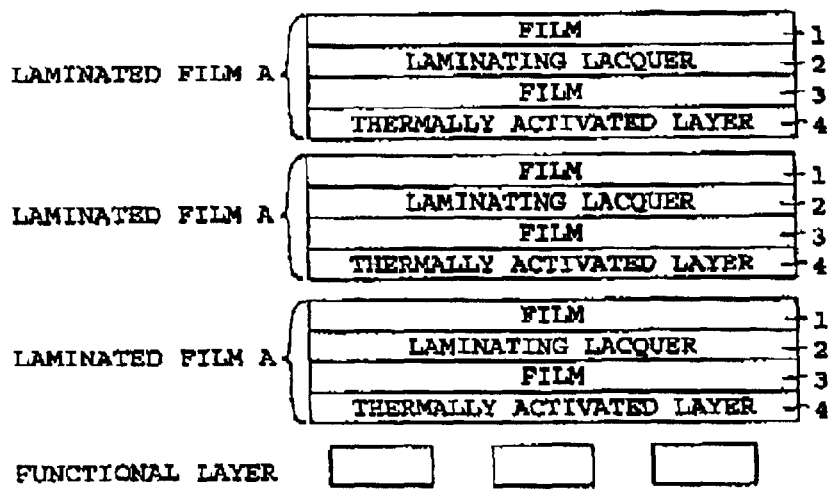
FIG. 4 shows one example of a composite film comprising three multi-layered laminated films in accordance with the present invention.

FIG. 4 shows one example of a composite film in accordance with an embodiment of the invention wherein the halogen-free composite film includes three stacked multi-layered laminated films sealingly engaging one side of a functional element. In this example, each of the multi-layered laminated films are the same, but this does not necessarily have to be the case in all applications.

Figure 3:
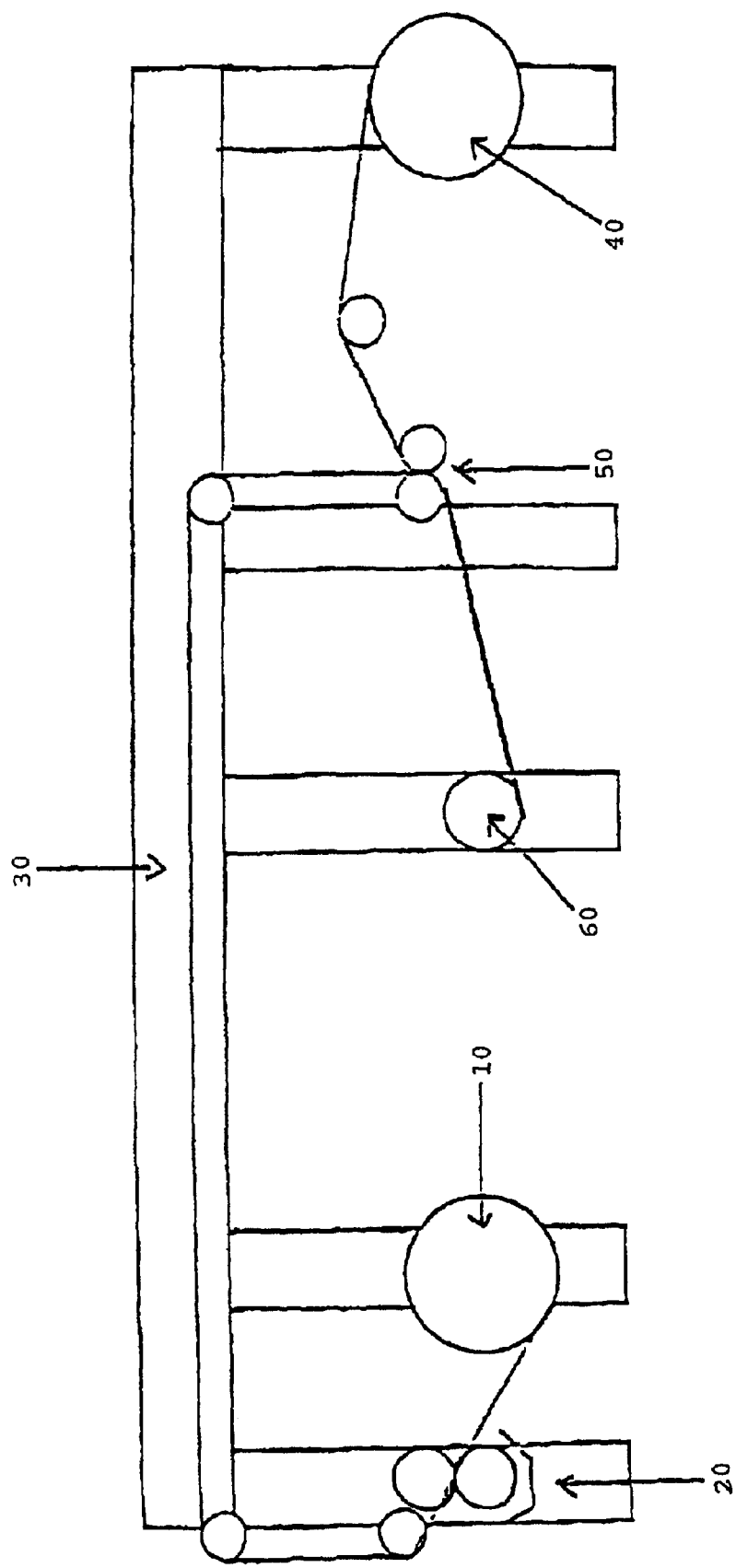
FIG. 3 is a schematic diagram of a lacquering and laminating system for producing a composite film in accordance with the present invention.

FIG. 3 shows a schematic representation of the lacquering and laminating system for producing the laminated film. The film to be laminated is located on roller 10, and this film is transported to the applicator unit 20, where the laminating adhesive is applied by means of appropriate application technologies, such as smooth roller application, gridded roller application, or brushed application. After application of the laminating adhesive, the coated film is transported to the drying tunnel 30. Located at the end of the drying tunnel is a supply roll device with another film 40; the two films are bonded together in the laminating station 50. Next, this laminated film is reeled by an appropriate device 60 and the adhesive is cured. When needed, the incoming film is coated with a thermally activated substance.

EXAMPLE 1

To manufacture a first laminated film, a PPS film was used as the first film. Then a polyurethane-based laminating adhesive was applied to this film by an appropriate application technology, depending on the subsequent application, by smooth roller application, gridded roller application, brushed application, or doctor blade chamber system. It is advantageous for the application weight of the laminating adhesive to be from 2 $g/m^2$ to 40 $g/m^2$, preferably 4 $g/m^2$ to 10 $g/m^2$ wet application, which corresponds to a dry coat between 2 $g/m^2$ and 5 $g/m^2$, preferably 3 $g/m^2$. Gridded roller application should be used when a smooth, glossy and visually attractive film is to be produced. The adhesive layer thus applied was dried in a drying tunnel at temperatures from 80° C. to 180° C., preferably 100° C. to 120° C. During the process, the solvents that were employed evaporated, and the still slightly sticky laminating lacquer remained. At the end of the drying tunnel, the adhesive-coated film was bonded in a laminating station to the incoming second film. The composite was reeled and the adhesive cured to its final strength over a period of 3 to 10 days.

EXAMPLE 2

The laminated film manufactured as in Example 1 can if needed be coated on the sealing film side of the incoming film with a thermally activated substance, for example a saturated, branched copolyester, using the application technology mentioned above. This coating with a thermally active substance is especially recommended for the manufacture of ribbon cables, since the two laminated films are capable of sealing to one another but not to the stranded metal wires that are used, for example Cu or Cu—Ni. With a very thin metal foil of up to 30 $\mu$m, the thermally activated substance can be omitted if desired.

EXAMPLE 3

To manufacture a flexible ribbon cable, two laminated films, which were manufactured as described in example 1, were laminated. In this example, stranded copper wire was used as the metallic conductor. These stranded copper wires were cut in foil form on the laminating machine into narrow strips of 0.3 to 50 mm, depending on the application, and laminated between the two laminated films by hot laminating rollers at 150° C. to 400° C., preferably 180° C. to 280° C. During this process, the thermally activated substance or the second film of the first laminated film becomes thermoplastic and fuses to the lacquer layer of the second laminated film.

EXAMPLE 4

To manufacture an insulating film for a flexible ribbon cable, a film of PPS and pretreated, hot-sealing polyester film or a polyamide film with different film thicknesses of 25, 35, 50 and 75 $\mu$m was used as the laminated film. A polyurethane system was used as the laminating adhesive. For the conductor material, copper in the form of rolled wires or cut foils was used, where the conductor material had a thickness of 0.01 mm to 0.3 mm and a width of 0.3 mm to 50 mm. The laminated films to be laminated were pressed by hot rollers with a roller temperature of 150° C. to 200° C. The laminating speed was 5 m/min to 50 m/min.

The ribbon cable thus produced had no air inclusions in the seal area, and also exhibited no capillary action on the conductor edges in the finished cable. It was resistant to chemicals, especially to various fuels, acids, and antifreeze agents, it had excellent temperature resistance, was resistant to hydrolysis, could be produced with no halogens, and had excellent flame resistant characteristics.

EXAMPLE 5

To manufacture a laminated film with shielding on the inside, the PPS film used as the outer film is vacuum-metallized with copper in a separate step prior to the laminating step. Then in the laminating unit, the laminating adhesive is applied to the copper metallized side. Next, the second film is applied, as described above. In a laminated film that is to have shielding on the outside, a protective lacquer is applied to the copper metallized PPS film, and then the laminating adhesive is applied to the first film, and then the second film is bonded to the first one.

In addition to the features and combinations of features presented in the preceding description, the figures and drawings, and the claims, the present invention includes without limitation all concepts, principles and generalizations that one skilled in the art can recognize therefrom as a matter of course with his specialized knowledge in this field. In particular, all variations, combinations, modifications and substitutions that the expert can recognize as a matter of course from the documents themselves and/or from application of his specialized knowledge reside within the scope of the invention.

What is claimed is:

1. A halogen-free film comprising at least 3 to N sealable, multi-layered laminated films, wherein N is an integer from 4 to 10, each multi-layered laminated film comprising a first film, a second film and a laminating adhesive or lacquer between the first and second films, said multi-layered laminated films forming a stacked, halogen-free composite film sealingly engaging one side of a functional element.

2. A composite film according to claim 1 wherein the functional element is a printed circuit board, a sensor, a metallic stranded wire, a metallic conductor material, or an electronic component.

3. A composite film according to claim 1 wherein each of the sealable, multi-layered laminated films are identical to one another.

4. A composite film according to claim 1 wherein the second film of each laminated film comprises a thermally activated substance.

5. A composite film according to claim 4 wherein the thermally activated substance is selected from the group consisting of: cyclo-olefin copolymers, polyesters, polyurethanes, acrylates and derivates thereof, vinyl acetate copolymers, polyvinyl alcohols, polyvinyl butyrals, polyvinyl acetates, sealable maleic resins, alkyd resins, polyolefins, polyamides and saturated, unsaturated, linear and branched copolyesters or multi-component polyurethane primer systems.

6. A composite film according to claim 1 wherein the first and the second film of each laminated film is selected from the group consisting of: liquid crystal polymer, polyphenylene sulfide, polyethylene terephthalate, polyethylene naphthalate, polyketone, polyetherkatone, polyetheretherketone, polyetherketone-ketone, polyetheretherketoneketone, polyetherimide, polyether sulfane, polysulfone, cyclo-olefin copolymer, and polyamide films.

7. A composite film according to claim 6 wherein the laminating adhesive or lacquer is selected from the group consisting of; acrylates, polyurethanes, polyester polyols, polyester urethanes, epoxides, copolyesters or natural adhesive resins, which can be used as single-component or multi-component systems.

8. A composite film according to claim 1 wherein the laminating adhesive or lacquer is selected from the group consisting of acrylates, polyurethanes, polyester polyols, polyester urethanes, epoxides, copolyesters or natural adhesive resins, which can be used as single-component or multi-component systems.

9. A composite film according to claim 1 wherein the wet application weight of the laminating adhesive is 2 g/m$^2$ to 40 g/m$^2$.

10. A composite film according to claim 1 wherein the first and second films of the individual laminated films each have a thickness between 10 $\mu$m and 100 $\mu$m.

11. A method for manufacturing a halogen-free composite film having at least 3 to N sealable, multi-layered laminated films, wherein N is an integer from 4 to 10, the method comprising:

producing each multi-layered laminated film by applying a laminating adhesive to a first film;

thereafter drying the first film in a drying tunnel at temperatures from approximately 80° C. to 180° C.;

joining a second film at the end of the drying tunnel to the first film; and curing said laminating adhesive of said first film; and thereafter providing a functional element between two of said at least 3 to N sealable, multi-layered laminated films; and laminating said two multi-layered laminated films together to sealingly engage said functional element.

12. A method according to claim 11 further comprising coating the second film with a thermally activated substance.

13. A method according to claim 12 wherein the thermally activated substance is selected from the group consisting of: cyclo-olefin copolymers, polyesters, polyurethanes, acrylates and their derivates, vinyl acetate copolymers, polyvinyl alcohols, polyvinyl butyrals, polyvinyl acetates, sealable maleic resins, alkyd resins, polyolefins, polyamides and saturated, unsaturated, linear and branched copolyesters or multi-component polyurethane primer systems.

14. A method according to claim 11 wherein the first and the second film of each laminated film is selected from the group consisting of: liquid crystal polymer, polyphenylene sulfide, polyethylene terephthalate, polyethylene naphthalate, polyketone, polyetherketone, polyetheretherketone, polyetherketone-ketone, polyetheretherketoneketone, polyetherimide, polyether sulfone, polysulfone, cyclo-olefin copolymer, and polyamide films.

15. A method according to claim 11 wherein the laminating adhesive is selected from the group consisting of: acrylates, polyurethanes, polyester polyols, polyester urethanes, epoxides, copolyesters or natural adhesive resins, which are used as single-component or multi-component systems.

16. A method according to claim 11 wherein the laminating adhesive is applied wet and the wet application weight of the laminating adhesive is 2 g/m$^2$ to 40 g/m$^2$.

17. A method according to claim 11 wherein the first and second films of the individual laminated films each have a thickness between 10 $\mu$m and 100 $\mu$m.

18. A method according to claim 11 wherein said functional element is an electrically conductive layer, and comprising vacuum depositing a metal layer between the first and second films.

19. A method according to claim 18 wherein the vacuum deposited metal layer is copper or aluminum.

* * * * *